United States Patent
Cheng et al.

(10) Patent No.: US 10,008,601 B2
(45) Date of Patent: Jun. 26, 2018

(54) SELF-ALIGNED GATE CUT WITH POLYSILICON LINER OXIDATION

(71) Applicant: INTERNATIONAL BUSINESS MACHINES CORPORATION, Armonk, NY (US)

(72) Inventors: Kangguo Cheng, Schenectady, NY (US); Peng Xu, Guilderland, NY (US)

(73) Assignee: International Business Machines Corporation, Armonk, NY (US)

(*) Notice: Subject to any disclaimer, the term of this patent is extended or adjusted under 35 U.S.C. 154(b) by 0 days. days.

(21) Appl. No.: 15/295,277

(22) Filed: Oct. 17, 2016

(65) Prior Publication Data

US 2018/0108770 A1    Apr. 19, 2018

(51) Int. Cl.
| | |
|---|---|
| H01L 27/088 | (2006.01) |
| H01L 29/78 | (2006.01) |
| H01L 29/06 | (2006.01) |
| H01L 29/423 | (2006.01) |
| H01L 21/306 | (2006.01) |
| H01L 21/308 | (2006.01) |

(Continued)

(52) U.S. Cl.
CPC ........ *H01L 29/785* (2013.01); *H01L 21/3085* (2013.01); *H01L 21/30604* (2013.01); *H01L 21/324* (2013.01); *H01L 29/0649* (2013.01); *H01L 29/4236* (2013.01); *H01L 29/66795* (2013.01)

(58) Field of Classification Search
CPC ............. H01L 21/3065; H01L 21/3081; H01L 21/3086; H01L 21/31055; H01L 21/31056; H01L 21/31105; H01L 21/31111; H01L 21/31116; H01L 21/3213; H01L 21/32133; H01L 21/32135; H01L 21/823821; H01L 27/0924; H01L 21/823828; H01L 21/823431; H01L 27/0886; H01L 27/092; H01L 27/10826; H01L 27/10879; H01L 27/1211; H01L 29/41791; H01L 29/66795; H01L 2924/13067; H01L 29/185; H01L 29/2003; H01L 29/2006; H01L 29/201; H01L 29/2206; H01L 29/7855; H01L 2029/7858; H01L 29/786; H01J 2237/334; H01J 2237/3341

See application file for complete search history.

(56) References Cited

U.S. PATENT DOCUMENTS

| | | |
|---|---|---|
| 6,403,486 B1 | 6/2002 | Lou |
| 8,846,491 B1 | 9/2014 | Pham et al. |
| 9,064,932 B1 | 6/2015 | Pham et al. |

(Continued)

*Primary Examiner* — Sonya D McCall Shepard
(74) *Attorney, Agent, or Firm* — Tutunjian & Bitetto, P.C.; Vazken Alexanian

(57) ABSTRACT

A method of forming a semiconductor device that includes forming a gate structure over a plurality of fin structures, wherein the gate structure provides a first fill pinch off between the fin structures separated by a first pitch; and forming a material stack of a silicon containing layer, and a dielectric layer over the plurality of fin structures, wherein the dielectric provides a second fill pinch off between fin structures separated by a second pitch. The silicon containing layer is converted into an oxide material layer. The second dielectric that provides the second fill pinch off is removed, and an opening is etched in a remaining silicon containing layer exposed by removing the second fill pinch off. An underlying gate cut region is etched in the gate structure using the opening in the remaining portion of the silicon containing layer.

16 Claims, 11 Drawing Sheets

(51) Int. Cl.
  *H01L 21/324* (2006.01)
  *H01L 29/66* (2006.01)

(56) References Cited

U.S. PATENT DOCUMENTS

| | | |
|---|---|---|
| 9,236,437 B2 | 1/2016 | Zaleski et al. |
| 9,252,021 B2 | 2/2016 | Ng et al. |
| 9,263,442 B2 | 2/2016 | Anderson et al. |
| 2015/0236106 A1 | 8/2015 | Zaleski et al. |
| 2015/0279971 A1 | 10/2015 | Xie et al. |
| 2015/0325482 A1 | 11/2015 | Hu et al. |
| 2015/0340461 A1 | 11/2015 | Wei et al. |
| 2016/0056181 A1 | 2/2016 | Anderson et al. |

SELF-ALIGNED GATE CUT WITH POLYSILICON LINER OXIDATION

BACKGROUND

Technical Field

The methods and structures described herein relate to gate structures used in semiconductor devices, and methods for forming gate structures to semiconductor devices including fin structures.

Description of the Related Art

Modern integrated circuits are made up of literally millions of active devices such as transistors. Field effect transistors (FETs) are widely used in the electronics industry for switching, amplification, filtering and other tasks related to both analog and digital electrical signals. Most common among these are metal oxide semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Continuing trends in semiconductor device manufacturing include a reduction in electrical device feature size (scaling).

SUMMARY

In one embodiment, a method of forming a semiconductor device is described herein that includes providing at least two regions of fin structures, wherein the fin structures within each of the at least two regions has a first pitch of separation and a second pitch of separation is present between adjacent regions. A gate structure is formed over the fin structures extending across the at least two regions, wherein the gate structure provides a first fill pinch off between the fin structures separated by the first pitch. A material stack of a first dielectric layer, a semiconductor containing layer, and a second dielectric layer is formed, wherein the second dielectric provides a second fill pinch off between fin structures separated by the second pitch. The semiconductor containing layer is converted into an oxide material layer. The second dielectric layer that provides the second fill pinch off is removed. An opening is etched in a remaining portion of the semiconductor containing layer that is exposed by removing the second fill pinch off using the oxide material layer as a first etch mask. An exposed portion of the first dielectric layer is etched using the opening in the remaining portion of the semiconductor containing layer as a second etch mask. The method continues with etching the gate cut region of the gate structure using the etched first dielectric layer as a gate cut region etch mask.

In another embodiment, the method of forming a semiconductor device includes forming a gate structure over a plurality of fin structures wherein adjacent fin structures are separated by at least two pitch dimensions. In one embodiment, the gate structure provides a first fill pinch off between the fin structures separated by a first pitch. A material stack may be formed on the fin structures, wherein the material stack includes a first dielectric layer, a silicon containing layer, and a second dielectric layer. The second dielectric provides a second fill pinch off between fin structures separated by a second pitch. The method further includes converting the silicon containing layer into an oxide material layer and removing the second dielectric that provides the second fill pinch off. An opening is etched in a remaining silicon containing layer exposed by removing the second fill pinch off using the oxide material layer as a first etch mask aligned to a gate cut region. An exposed portion of the first dielectric layer and the underlying gate cut region is etched using the opening in the remaining portion of the silicon containing layer that is aligned to the gate cut region.

In another embodiment, the method of forming the semiconductor device includes forming a gate structure over a plurality of fin structures, wherein the gate structure provides a first fill pinch off between the fin structures separated by a first pitch; and forming a material stack of a silicon containing layer, and a dielectric layer over the plurality of fin structures, wherein the dielectric provides a second fill pinch off between fin structures separated by a second pitch. The silicon containing layer is converted into an oxide material layer. The second dielectric that provides the second fill pinch off is removed, and an opening is etched in a remaining silicon containing layer exposed by removing the second fill pinch off. An underlying gate cut region is etched in the gate structure using the opening in the remaining portion of the silicon containing layer.

In another aspect, a semiconductor device is provided. The semiconductor device can include at least two regions of fin structures, wherein the fin structures within each of the at least two regions has a first pitch of separation and a second pitch of separation is present between adjacent regions. In some embodiments, a gate structure is present on each region of said at least two regions of fin structures, wherein the gate structure for each region is separate from an adjacent gate structure by a gate cut trench. A conformal dielectric layer (provided by the first dielectric layer) is present overlying at least each of the gate structures. The conformal dielectric layer has edges aligned to edges of the gate structures at the gate cut trench.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
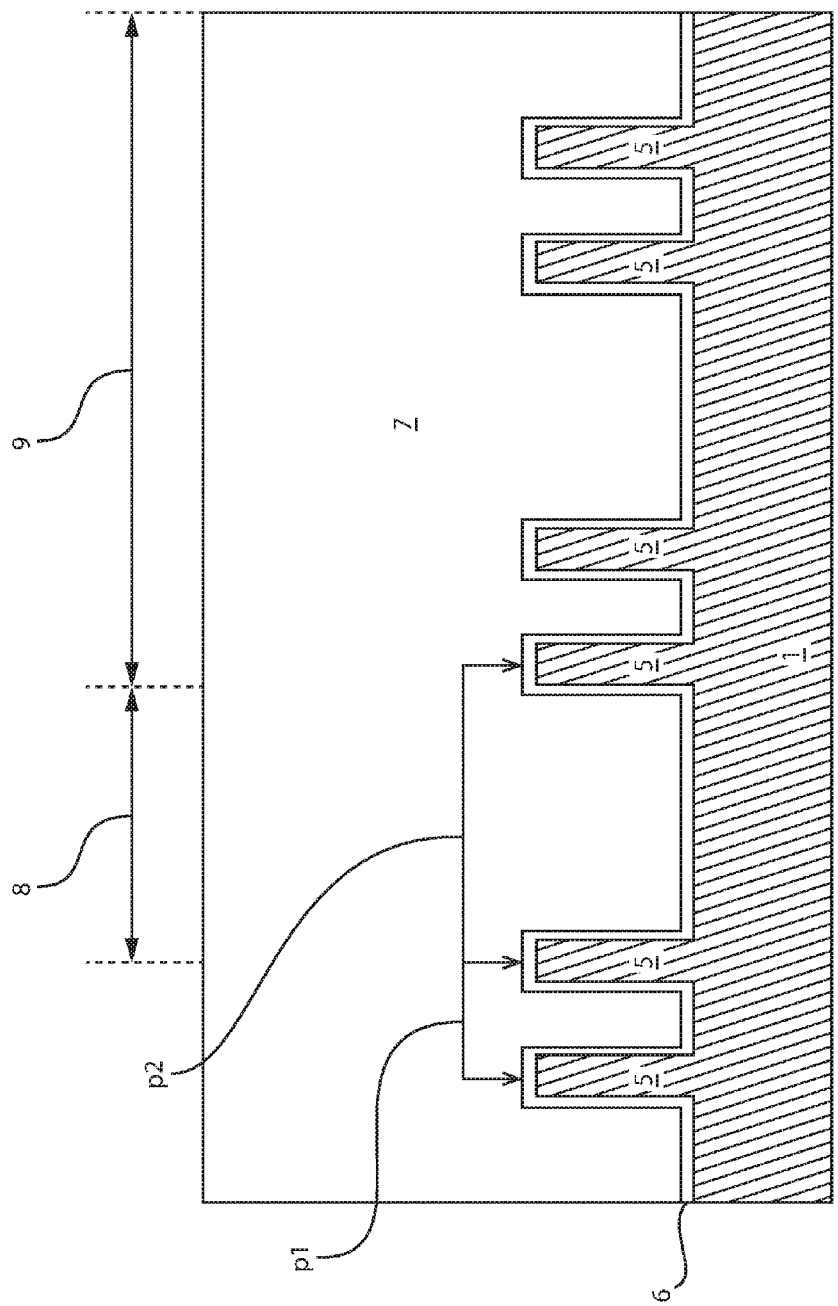
FIG. 1 is a side cross-sectional view depicting one embodiment of a sacrificial gate structure present on at least two regions of fin structures, wherein the fin structures within each of the at least two regions has a first pitch of separation and a second pitch of separation is present between adjacent regions.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present description. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. As used herein a "field effect transistor" is a transistor in which output current, i.e., source-drain current, is controlled by the voltage applied to the gate. A field effect transistor has three terminals, i.e., gate structure, source region and drain region. A "gate structure" means a structure used to control output current (i.e., flow of carriers in the channel) of a semiconducting device through electrical or magnetic fields. As used herein, the term "channel" is the region underlying the gate structure and between the source and drain of a semiconductor device that becomes conductive when the semiconductor device is turned on. As used herein, the term "source" is a doped region in the semiconductor device, in which majority carriers are flowing into the channel. As used herein, the term "drain" means a doped region in semiconductor device located at the end of the channel, in which carriers are flowing out of the transistor through the drain. In some embodiments, the semiconductor devices disclosed herein are fin type field effect transistors, i.e., FinFETs. A finFET is a field effect transistor embodied in a fin structure. As used herein, the term "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure.

The etch steps for forming the gate structures of semiconductor devices, such as fin type field effect semiconductor devices (FinFETs), e.g., metal oxide semiconductor field effect transistors (MOSFETs), are increasingly subject to misalignment of photoresist masks due to the limits of lithography and increased device scaling. For example, MOSFET scaling down results in difficult Gate-cut due to overlay shift, i.e., misalignment. The gate-cut is the etch process that defines the tip to tip distance separating adjacent gate structures of adjacent semiconductor devices. In dummy gate cut last (CT last) process flow, the etch process for cutting the dummy gate structure, i.e., sacrificial gate structure, is after the formation of the source and drain epitaxial material; after the formation of an interlevel dielectric over the source and drain regions; and after a planarization process that is applied to the interlevel dielectric so that the upper surface of the interlevel dielectric is coplanar with the upper surface of the dummy gate structure.

The methods and structures described herein introduces a method and structure for enabling self-align gate cut. More specifically, the methods and structures described herein employ a process flow that defines the gate cut region using a selective etch process sequence in combination with a masking sequence that includes a combination of a nitride containing layer, a polysilicon containing layer and a nitride pinch off fill between close pitch fin structures that when applied in combination with an oxidation treatment applied to the polysilicon containing layer enables a self-aligned gate cut. The method and structures for employing self-aligned, are now described in more detail with reference to FIGS. 1-11.

FIG. 1 depicts one embodiment of a sacrificial gate structure 7 present on at least two regions of fin structures 5, wherein the fin structures 5 within each of the at least two regions has a first pitch P1 of separation and a second pitch P2 of separation is present between adjacent regions. The fin structures 5 are typically formed from a semiconductor substrate 1. The substrate 1 is typically a bulk semiconductor substrate. The bulk semiconductor substrate, and subsequently the fin structures 5 that are formed therefrom, can be composed of a type IV semiconductor material. For example, the semiconductor material of the substrate 1, (as well as the fin structure 5) may include, but is not limited to silicon, strained silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, and combinations thereof. In some other embodiments, the substrate 1 may be composed of another semiconductor material besides a type IV semiconductor material, such as a type III-V semiconductor material, such as gallium arsenic, indium arsenic, indium phosphide, as well as other III/V and II/VI compound semiconductors. Other semiconductor materials may also be suitable so long as they thermally expand, i.e., volumetrically expand, in response to a thermal treatment, such as thermal oxidation.

The plurality of fin structures 5 may be formed deposition photolithography and etch processes. For example, forming the plurality of fin structures 5 may include forming a dielectric layer (for forming a hardmask) on an upper surface of the substrate 1; etching the dielectric layer using spacer image transfer (SIT) to form a hard mask from the dielectric layer; and etching the substrate 1 using the hardmask with an anisotropic etch to a depth to provide the fin structures 5. In one embodiment, the patterning process used to define each of the fin structures 5 is a spacer image transfer (SIT) process. More specifically, the SIT process may be used to pattern the hardmask, wherein the hardmask is then used in an etch process to define the fin structures 5. The SIT process can include forming a mandrel material layer (not shown) on the layer that provides the hard mask 10. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., amorphous carbon. The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the dielectric layer that provides the hardmask 10.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 5.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the dielectric layer that provides the hard mask. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. Following patterning of the hard mask, the spacers formed during the SIT process can be removed. For example, the dielectric spacers may be removed using an etch process or a planarization process.

In a following process step, the hard mask protects the portions of the substrate 1 that provide the fin structures 5, while the exposed portions of the substrate 1 that are not covered by the hard mask are etched to form the trenches that separate the fin structures in the plurality of fin structures 5. Similar to the etch process for patterning the hard mask, the etch process for forming the plurality of fin structures 5 may be an anisotropic etch, such as reactive ion etch (RIE), plasma etch, laser etching or a combinations thereof. The etch process removes the exposed portions of the substrate 1 selectively to the hard mask. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater, or 1000:1 or greater. Besides SIT process, other suitable patterning techniques such as lithography followed by RIE can be used to form fins.

The fin structures 5 formed at this stage of the process flow may have a height ranging from 5 nm to 200 nm. In another embodiment, each of the fin structures 5 has a first height ranging from 10 nm to 100 nm. In one example, each of the fin structures 5 has a height ranging from 20 nm to 50 nm. Each of the plurality of fin structures 5 may have a width ranging from 5 nm to 20 nm. In another embodiment, each of the fin structures 5 has a width ranging from 5 nm to 15 nm. In one example, each fin structure 5 has a width that is equal to 10 nm.

The fin structures 5 are arranged in regions for positioning devices with a space between adjacent regions for isolation of the devices. The section identified by reference number 8 represents the gate cut region, which is the region of the gate structure that is removed to isolate a first gate structure for a first set of devices in a first region from a second gate structure for a second set of devices in a second region. The section identified by reference number 9 represents the device region, which is the section in which the functional gate structure extends over at least on fin structure 5, and in the example provided over two fin structures. It is noted that in the device region 9, the gate structure may extend over any number of fin structures 5, and it is not intended that the devices disclosed herein be limited to including only two fin structures 5.

The pitch separating adjacent fin structures 5 in the device region 9 may be referred to as the first pitch P1. The term "pitch" describes the center to center distance separating adjacent structures, which may be repeating. The pitch P1 separating adjacent fin structures 5 in the device regions 9 may range from 10 nm to 50 nm. In another embodiment, the pitch P1 separating adjacent fin structures 5 may range from 20 nm to 40 nm. In one example, the pitch P1 is equal to 45 nm. The pitch P2 separating the adjacent fin structures in different regions, e.g., regions each including a plurality of fin structures 5, in which the gate cut is positioned is referred to as the second pitch P2. The pitch P2 separating adjacent fin structures 5 in the device regions 9 may range from 50 nm to 175 nm. In another embodiment, the pitch P2 separating adjacent fin structures 5 may range from 60 nm to 150 nm.

The sacrificial gate structures 7 are formed atop a channel region of the semiconductor device is present. The sacrificial gate structures 7 are composed of a material that may be removed selectively to the underlying active region, in which the geometry of the sacrificial gate structures 7 dictates the later formed functional gate structures, in which the sacrificial gate structures 7 may be replaced using a replacement metal gate (RMG) process flow. In some embodiments, the sacrificial gate structure 7 may be composed of a semiconductor material, such as silicon (Si), e.g., amorphous silicon or polysilicon. In some embodiments, a silicon oxide layer 6 may be present between the sacrificial gate structure and the fin structures 5.

Following the formation of the sacrificial gate structures 25, source and drain regions (not shown) may be formed on the source and drain portions of the fin structures, i.e., on the opposing ends of the fin structures 5 with the channel region of the fin structure 5 in between, wherein the sacrificial gat structure 25 is on the channel region. The source and drain regions may be formed by ion implantation or by forming an in-situ doped epitaxial semiconductor material. For example, when the active regions include fin structures, the source and drain regions may be formed by epitaxially forming in situ doped semiconductor material on the portions of the fin structures that are on opposing sides of the channel region of the fin structures. In some examples, the epitaxial semiconductor material that provides the source and drain regions merges the adjacent fin structure source and drain region portions within the device regions 9. The source and drain material does not extend into the gate cut region 8.

Following formation of the source and drain regions, an interlevel dielectric layer (not shown) is formed between and over the sacrificial gate structures 7, the active regions, and the source and drain regions. The interlevel dielectric layer may be formed using a deposition method, such as chemical vapor deposition (CVD), e.g., plasma enhanced chemical vapor deposition (PECVD), deposition from chemical solution, or spin on deposition. Following deposition, the interlevel dielectric layer is planarized, e.g., planarized by chemical mechanical planarization (CMP), so that the upper surface of the interlevel dielectric layer is coplanar with the upper surface of the sacrificial gate structures 7.

Figure 2:
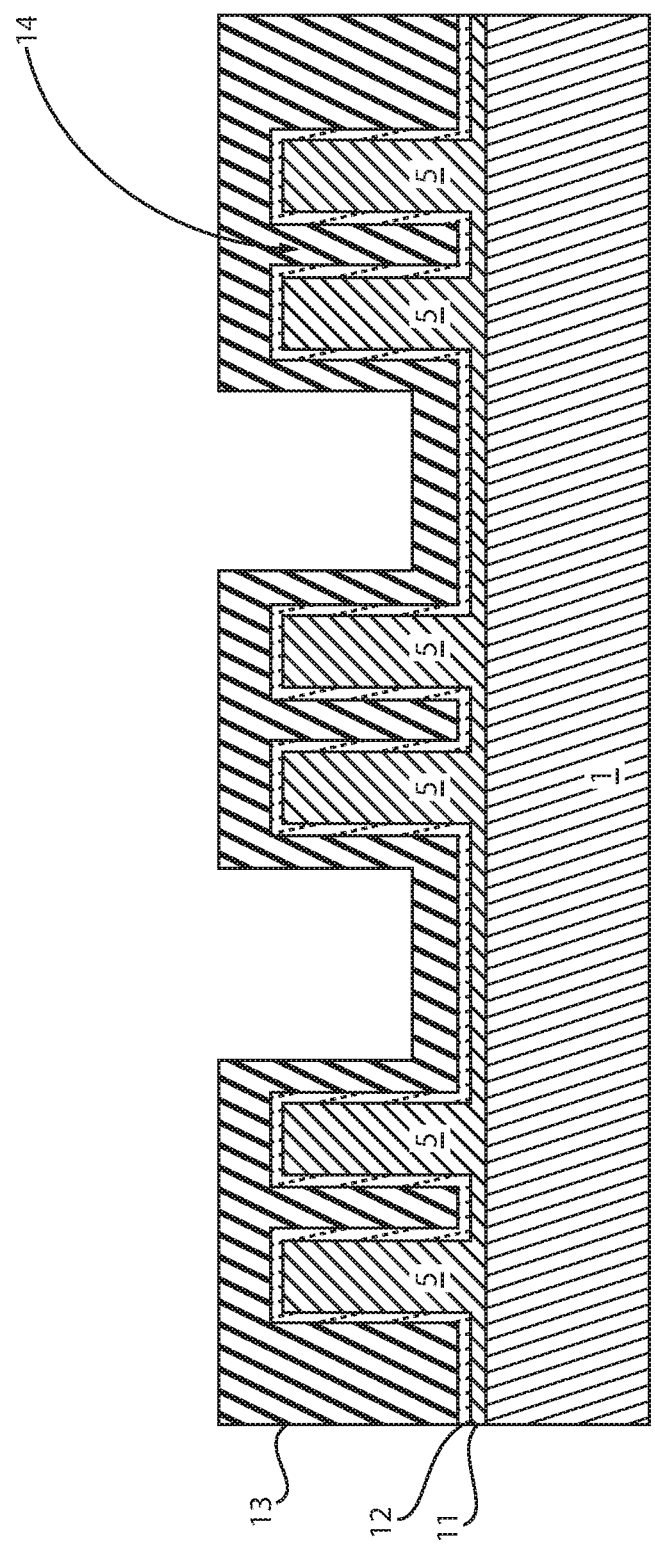
FIG. 2 is a side cross-sectional view depicting removing the sacrificial gate structure, and forming a functional gate structure over the fin structures extending across the at least two regions, wherein the gate structure provides a first fill pinch off between the fin structures separated by the first pitch.

FIG. 2 depicts one embodiment of removing the sacrificial gate structure 7, and forming a functional gate structure (e.g., gate dielectric 11, work function metal 12, and gate electrode 13) over the fin structures 5 extending across the at least two regions 8, 9. The gate structure 11, 12, 13 provides a first fill pinch off between the fin structures 5 separated by the first pitch P1. The term "fill pinch off" denotes that the entirety of space between the adjacent fin structures 5 in the device region 9 is filled with gate material.

Removing the sacrificial gate structure 7 typically includes a selective etch process. For example, the sacrificial gate structure 7 and the silicon oxide layer 6 may be removed by an etch that is selective to the fin structures 5 and the substrate 1. The etch may be a wet chemical etch. The etch process may also be selective to the interlevel dielectric. Removing the sacrificial gate structure 7, and the silicon oxide layer 6 selectively to the interlevel dielectric layer, the fin structures 5 and the substrate 1 provides a gate trench, in which the functional gate structure is to be deposited atop at least the channel regions of the fin structures 5.

In a following step, the gate dielectric 11 is formed on the fin structures 5. The gate dielectric 11 may be deposited using chemical vapor deposition, e.g., plasma enhanced chemical vapor deposition (PECVD) or metal organic chemical vapor deposition (MOCVD), or the gate dielectric 11 may be deposited using atomic layer deposition (ALD). In one embodiment, the at least one gate dielectric 11 includes, but is not limited to, an oxide, nitride, oxynitride and/or silicates including metal silicates, aluminates, titanates and nitrides. In one example, when the at least one gate dielectric 11 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer 11 may vary, but typically, the at least one gate dielectric layer 11 has a thickness from 1 nm to 10 nm. In another embodiment, the at least one gate dielectric layer 11 has a thickness from 1 nm to 3 nm.

The gate structure may further include a work function adjusting layer 12. The work function adjusting layer 12 may be a nitride, including, but not limited to, titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. The work function adjusting layer 12 may be deposited using chemical vapor deposition or physical vapor deposition. Examples of PVD suitable for forming the work function adjusting layer include plating, electroless deposition, electroplating and combinations thereof. The physical thickness of the at least one gate dielectric layer may vary, but typically, the at least one gate dielectric layer 11 has a thickness from 1 nm to 10 nm. In another embodiment, the at least one gate dielectric layer 11 has a thickness from 1 nm to 3 nm. It is noted that the work function adjusting layer 12 and the gate dielectric 11 are deposited using a conformal deposition process. The term "conformal" denotes a layer having a thickness that does not deviate from greater than or less than 30% of an average value for the thickness of the layer.

Referring to FIG. 2, the gate electrode 13 may also be deposited using a conformal deposition process, in which the thickness of the material layer that is deposited for the gate electrode 13 is selected to completely fill the space between the fin structures 5 that are present within the device region 8 and are separated by the first pitch. By filling the space between the fin structures 5 having the first pitch in the device region, the gate electrode material provide the first fill pinch off. The second pitch P2 separating the adjacent regions of fin structures in which the gate cut region is to be positioned is greater than the first pitch P1. Therefore, the material layer for the gate electrode 13 does not fill the entirety of the space in the second pitch P2 portion of the structure, in which the gate cut is subsequently formed. In other embodiments, to provide the first fill pinch off, the gate electrode 13 may be formed using a non-conformal deposition process.

The conductive material of the gate electrode 13 may comprise polysilicon, SiGe, a silicide, a metal or a metal-silicon-nitride such as Ta—Si—N. Examples of metals that can be used as the gate electrode 13 include, but are not limited to, Al, W, Cu, and Ti or other like conductive metals.

The layer of conductive material for the gate electrode 13 may be doped or undoped. If doped, an in-situ doping deposition process may be employed. Alternatively, a doped conductive material can be formed by deposition, ion implantation and annealing. The gate electrode 13 may be formed using a PVD deposition process, such as sputtering, plating, electroplating, electroless plating and combinations thereof. The gate electrode 13 may also be formed using chemical vapor deposition or atomic layer deposition.

Figure 3:
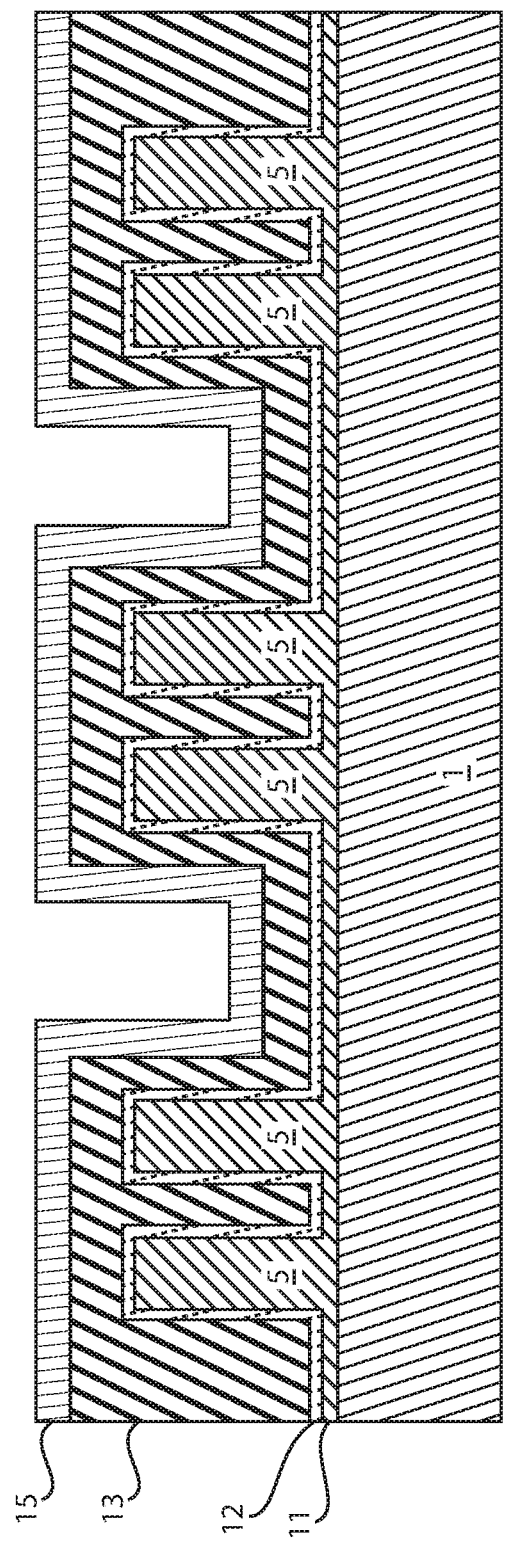
FIG. 3 is a side cross-sectional view depicting forming a first dielectric layer over the fin structures.

FIG. 3 depicts forming a first dielectric layer 15 over the fin structures 5. In some embodiments, the first dielectric layer 15 is formed directly on the portion of the gate structure, e.g., the gate electrode 13, that is present over the fin structures 5, as well as spanning across the substrate 1 between the adjacent fin structures 5 and the adjacent regions of fin structures. The first dielectric layer 15 may be blanket deposited, i.e., deposited over the entirety of, the structure depicted in FIG. 2. The first dielectric layer 15 is typically formed using a conformal deposition process, such as chemical vapor deposition, e.g., plasma enhanced chemical vapor deposition. The first dielectric layer 15 may be composed of a nitride containing dielectric. For example, the first dielectric layer 15 may be composed of silicon nitride, silicon oxynitride, or a combination thereof. The first dielectric layer 15 may have a thickness ranging from 2 nm to 20 nm. In another embodiment, the first dielectric layer 15 may have a thickness ranging from 5 nm to 10 nm. It is noted that the above listed compositions and thicknesses are provided for illustrative purposes only, and are not intended to limit the present disclosure, because other compositions and dimensions are equally applicable. For example, the first dielectric layer may be selected so that it can be etched selectively with respect to the subsequently formed semiconductor containing layer 16.

Figure 4:
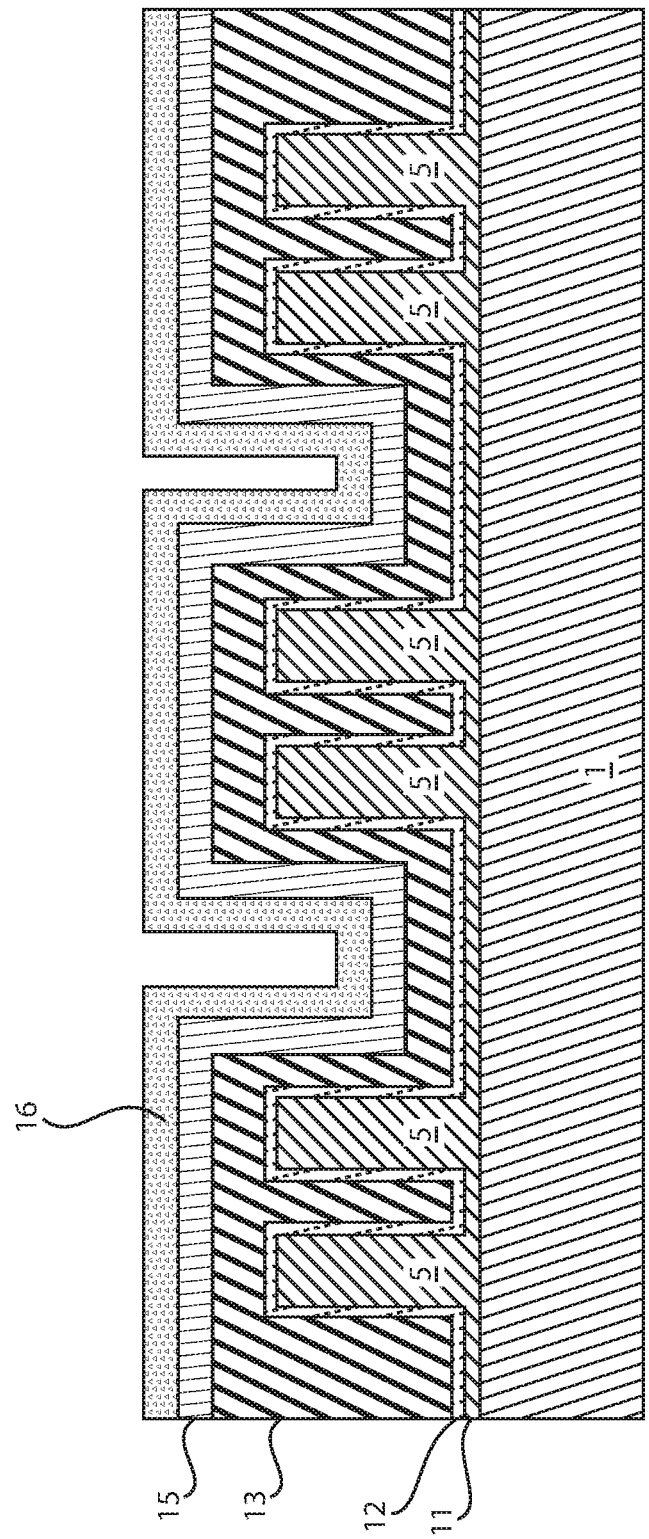
FIG. 4 is a side cross-sectional view depicting one embodiment of forming a semiconductor containing layer over the first dielectric layer.

FIG. 4 depicting one embodiment of forming a semiconductor containing layer 16 over the first dielectric layer. The semiconductor containing layer 16 is typically a silicon containing material layer. For example, the semiconductor containing layer may be silicon (Si), polysilicon, amorphous (Si), silicon germanium (SiGe), as well as other silicon containing materials that will form an oxide when subjected to an oxidizing atmosphere. The semiconductor containing layer 16 is blanket deposited atop the structure depicted in FIG. 3.

The semiconductor containing layer 16 can be conformally deposited. In some examples, the semiconductor containing layer 16 is formed using chemical vapor deposition (CVD) methods. Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In other embodiments, the semiconductor containing layer 16 may be formed using atomic layer deposition. "Atomic layer deposition" (ALD) as used herein refers to a vapor deposition process in which numerous consecutive deposition cycles are conducted in a deposition chamber. Typically, during each cycle a metal precursor is chemisorbed to the substrate surface; excess precursor is purged out; a subsequent precursor and/or reaction gas is introduced to react with the chemisorbed layer; and excess reaction gas (if used) and by-products are removed.

The semiconductor containing layer 16 may have a thickness ranging from 2 nm to 20 nm. In another embodiment, the semiconductor containing layer 16 may have a thickness ranging from 5 nm to 10 nm.

Figure 5:
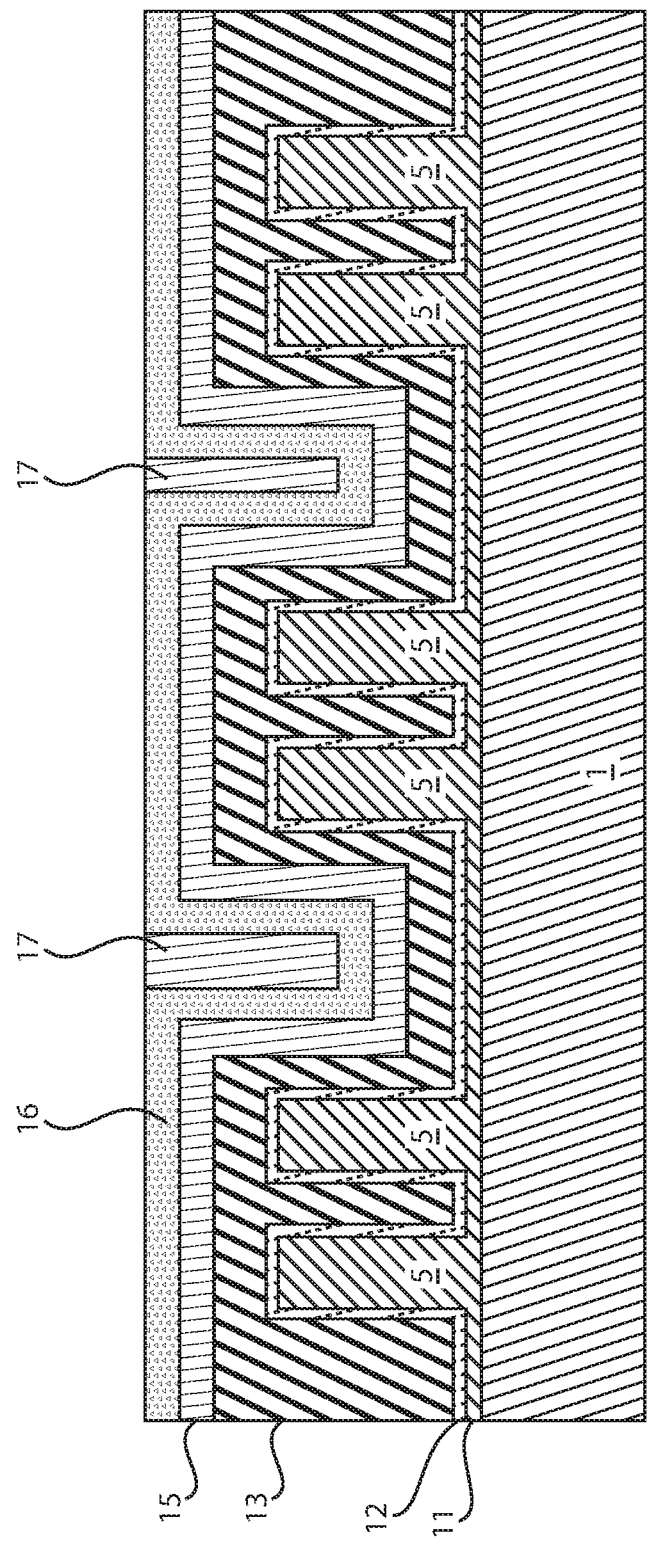
FIG. 5 is a side cross-sectional view depicting one embodiment of forming a second dielectric layer over the semiconductor containing layer, wherein the second dielectric provides a second fill pinch off between fin structures separated by the second pitch.

FIG. 5 depicting one embodiment of forming a second dielectric layer 17 over the semiconductor containing layer 16, wherein the second dielectric layer 17 provides a second fill pinch off between fin structures 5 separated by the second pitch P2. In some embodiments, the second dielectric layer 17 is formed directly on the portion of the semiconductor containing layer 16 that is present in the gate cut region of the device.

The second dielectric layer 17 may be composed of a nitride containing dielectric. For example, the second dielectric layer 17 may be composed of silicon nitride, silicon oxynitride, or a combination thereof. In some embodiments, the second dielectric layer 17 can have the same composition material as the first dielectric layer 15. The above compositions for the second dielectric layer 17 have provided for illustrative purposes only, and are not intended to limit the present disclosure. Any material that can function as an etch mask in accordance with the process flow described herein for forming the gate cut, i.e., also compatible with the compositions of the semiconductor dielectric layer 17, subsequently formed oxide material layer, and gate structure, is suitable for use as the material of the second dielectric layer 17.

The second dielectric layer 17 is deposited to fill the space that is present between the regions of fin structures 5 that provide separate devices. The pitch of separating the outermost fin structures 5 in each region is the second pitch P2 and extends over the portion of the device in which the gate cut is formed, as depicted in FIG. 5. The deposition process for forming the second dielectric layer 17 may be non-conformal.

The second dielectric layer 17 may be blanket deposited, i.e., deposited over the entirety of, the structure depicted in FIG. 4. The second dielectric layer 17 can be formed using a deposition process, such as chemical vapor deposition. To provide for a non-conformal filling deposition, the CVD process may be high density plasma chemical vapor deposition (HDPCVD). Other variations of CVD processes that may be used at this stage of the process flow may include Atmospheric Pressure CVD (APCVD), Low Pressure CVD (LPCVD), Plasma Enhanced CVD (PECVD), Metal-Organic CVD (MOCVD) and combinations thereof.

In some embodiments, the deposition step is followed by a planarization step that is applied to the second dielectric layer 17. The planarization process may be continued to provide that the upper surface of the second dielectric layer 17 is coplanar with an upper surface of the semiconductor containing layer 16, as depicted in FIG. 5. The planarization process may be provided by chemical mechanical planarization.

Figure 6:
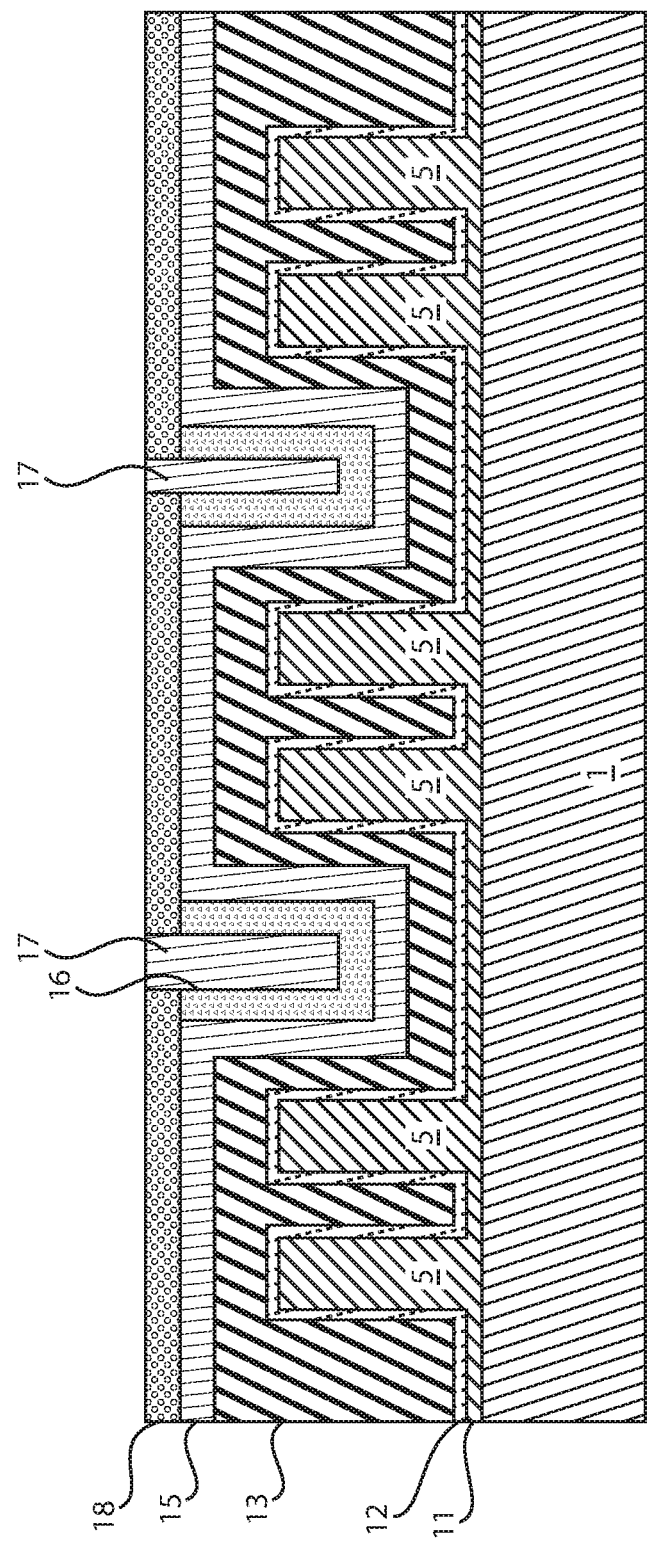
FIG. 6 is a side cross-sectional view depicting one embodiment of converting the semiconductor containing layer into an oxide material layer, in accordance with one embodiment of the present disclosure.

FIG. 6 depicts one embodiment of converting the exposed portion of the semiconductor containing layer 16 into an oxide material layer 18. The exposed portion of the semiconductor containing layer 16 is the uppermost portion of the layer that has an upper surface coplanar with the second dielectric layer 17. A remaining portion that is not exposed and is present extending over sidewalls of the fin structures 5 is not converted into an oxide.

The exposed portion of the semiconductor containing layer 16 may be converted to an oxide using oxidation processes. In oxidation, under exposure to oxygen, a silicon surface oxidizes to form silicon dioxide ($SiO_2$). Thermal oxidation of silicon (Si) is achieved by heating the semiconductor containing layer 16, e.g., silicon containing layer 16, to temperatures typically in the range of 900° C. to 1200° C. The atmosphere in the furnace where oxidation takes place can either contain pure oxygen or water vapor. Both of these molecules diffuse easily through the growing $SiO_2$ layer at high temperatures. Oxygen arriving at the silicon surface can then combine with silicon to form silicon dioxide.

In some embodiments, the exposed portion of the semiconductor containing layer 16, e.g., polysilicon semiconductor containing layer 16, may be converted to an oxide using implantation of an oxygen species. For example, the exposed portion of the semiconductor containing layer 16 may be doped with oxygen by ion implantation, or other implantation method, to convert the semiconductor material, e.g., polysilicon, to an oxide, e.g., silicon oxide.

Figure 7:
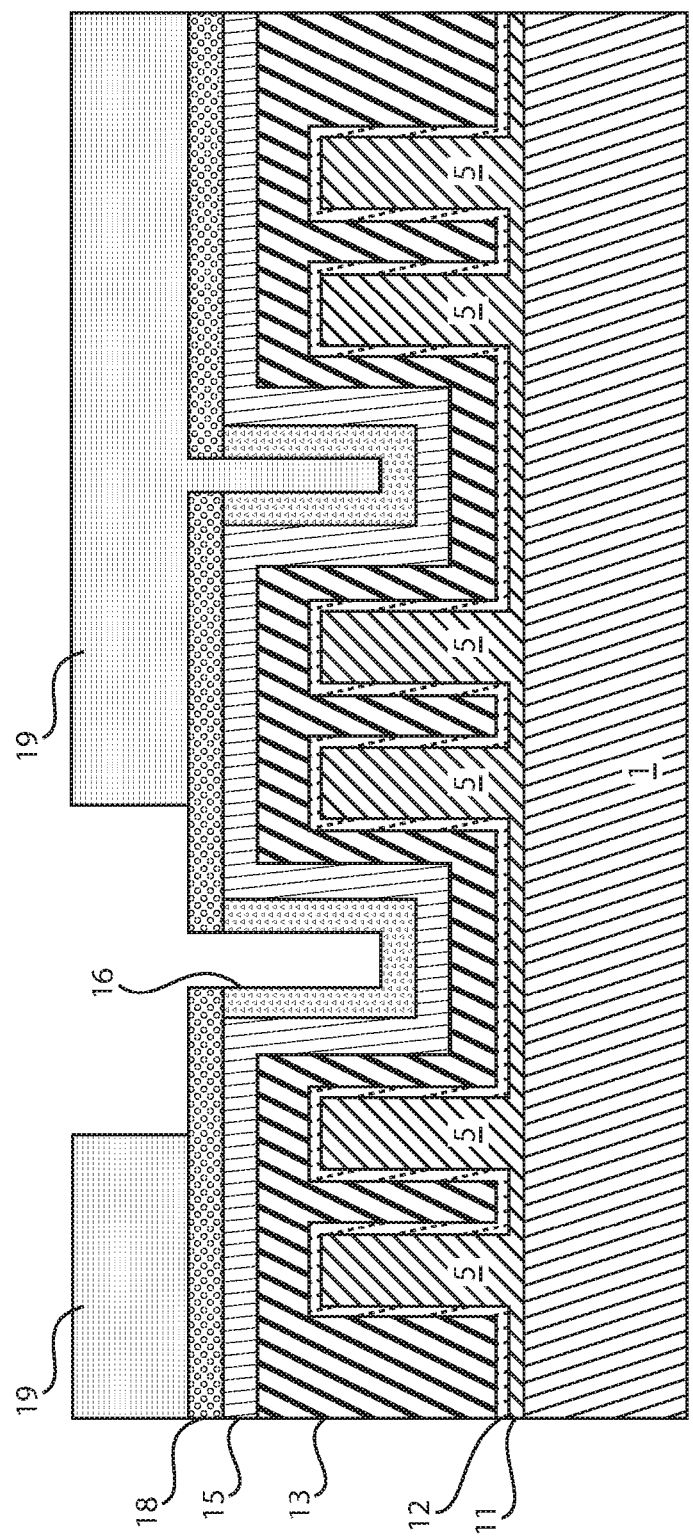
FIG. 7 is a side cross-sectional view depicting one embodiment of photoresist mask having an opening over the gate cut region of the device, and removing an exposed second dielectric layer that provides the second fill pinch off, in accordance with one the present disclosure.

FIG. 7 depicts one embodiment of forming a photoresist mask 19 having an opening over the gate cut region of the device, and removing an exposed second dielectric layer 17 that provides the second fill pinch off. Specifically, a patterned photoresist mask 19 is produced by applying a photoresist to the surface to be etched, exposing the photoresist to a pattern of radiation, and then developing the pattern into the photoresist utilizing a resist developer. Once the patterning of the photoresist mask 19 is completed, the sections covered by the photoresist mask 19 are protected while the exposed regions are removed using a selective etching process that removes the unprotected regions.

The second dielectric layer 17 may be removed by an etch process that is selective to the photoresist mask 19, the oxide material layer 18, and the remaining portion of the semiconductor containing layer 16. In one embodiment, the second dielectric layer is removed by a dry etch, such as reactive ion etch (RIE) or a plasma etch. In some embodiments, the second dielectric layer 18 is removed using a wet etch, such as a wet chemical etch. In some embodiments, the etch process of this stage of the process flow may be anisotropic. In other embodiments, the etch process at this stage of the process flow by a isotropic.

Figure 8:
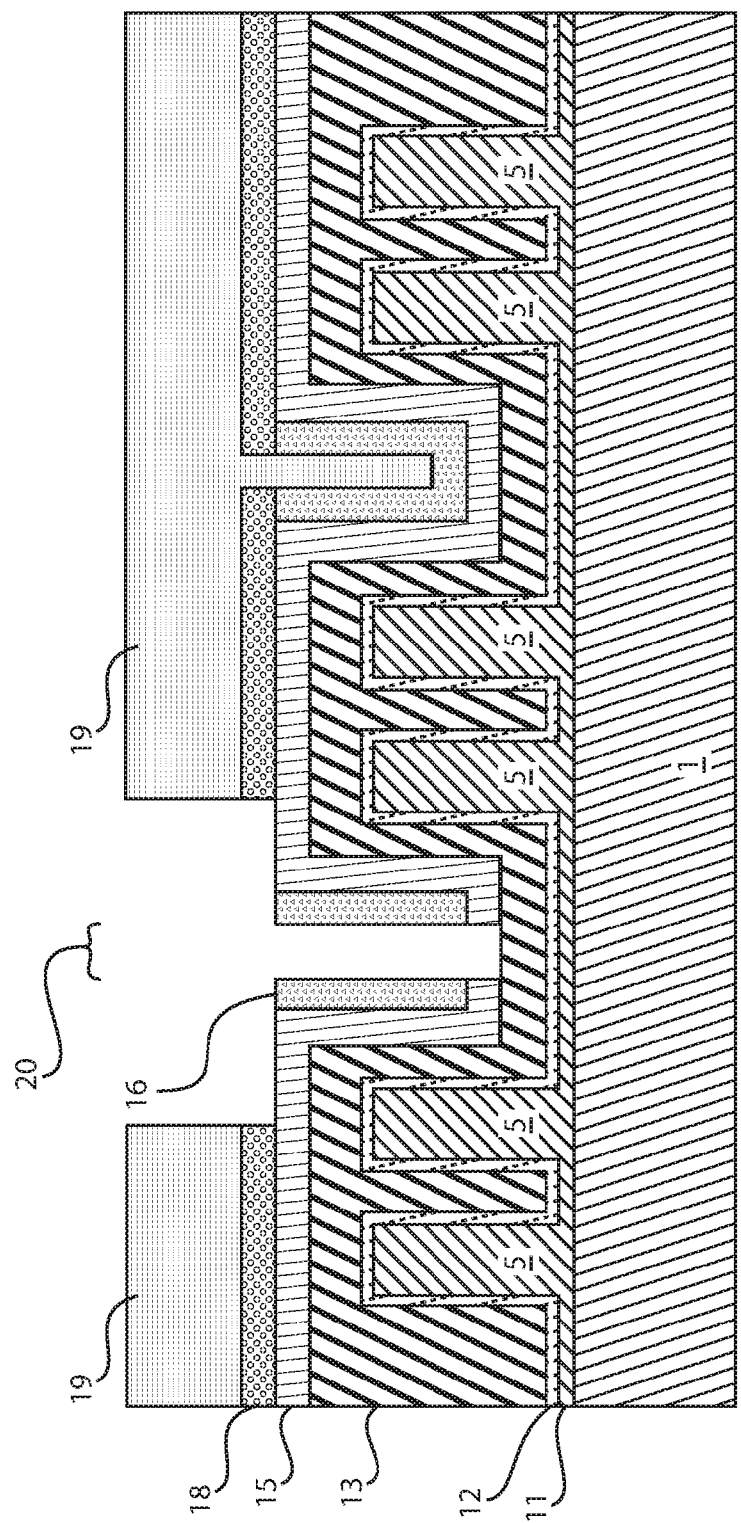
FIG. 8 is a side cross-sectional view depicting one embodiment of etching an opening in a remaining semiconductor containing layer exposed by removing the second fill pinch off using the oxide material layer as a first etch mask, in accordance with one embodiment of the present disclosure.

FIG. 8 depicts one embodiment of etching an opening 18 in a remaining semiconductor containing layer 16 exposed by removing the second fill pinch off, i.e., second dielectric layer 17, using the remaining semiconductor containing layer 16 as a first etch mask. The etch process at this stage of the process flow can remove the exposed portion remaining portion of the semiconductor layer 16 selectively to the oxide material layer 18. The etch may also be selective to the photoresist mask 19. In one embodiment, the exposed portion of the semiconductor layer 16 is removed by an anisotropic etch, such as reactive ion etching or laser etching.

FIG. 8 further depicts etching the portion of the first dielectric layer 15 that is exposed by removing the gate cut trench portion of the remaining semiconductor containing layer 16. The etch step for removing the exposed portion of the first dielectric layer 16 can also remove the exposed portion of the oxide containing material layer 17 that is not protected by the photoresist mask 19. The etch process for removing the exposed dielectric layer 16 may be selective to at least one of the gate electrode 13 of the gate structure, the remaining portion of the semiconductor containing layer 16 and the photoresist mask. In one embodiment, the aforementioned portion of the first dielectric layer 15 is removed by a dry etch, such as reactive ion etch (RIE) or a plasma etch. In some embodiments, the first dielectric layer 15 is removed using a wet etch, such as a wet chemical etch. In some embodiments, the etch process of this stage of the process flow may be anisotropic. In other embodiments, the etch process at this stage of the process flow by a isotropic.

Figure 9:
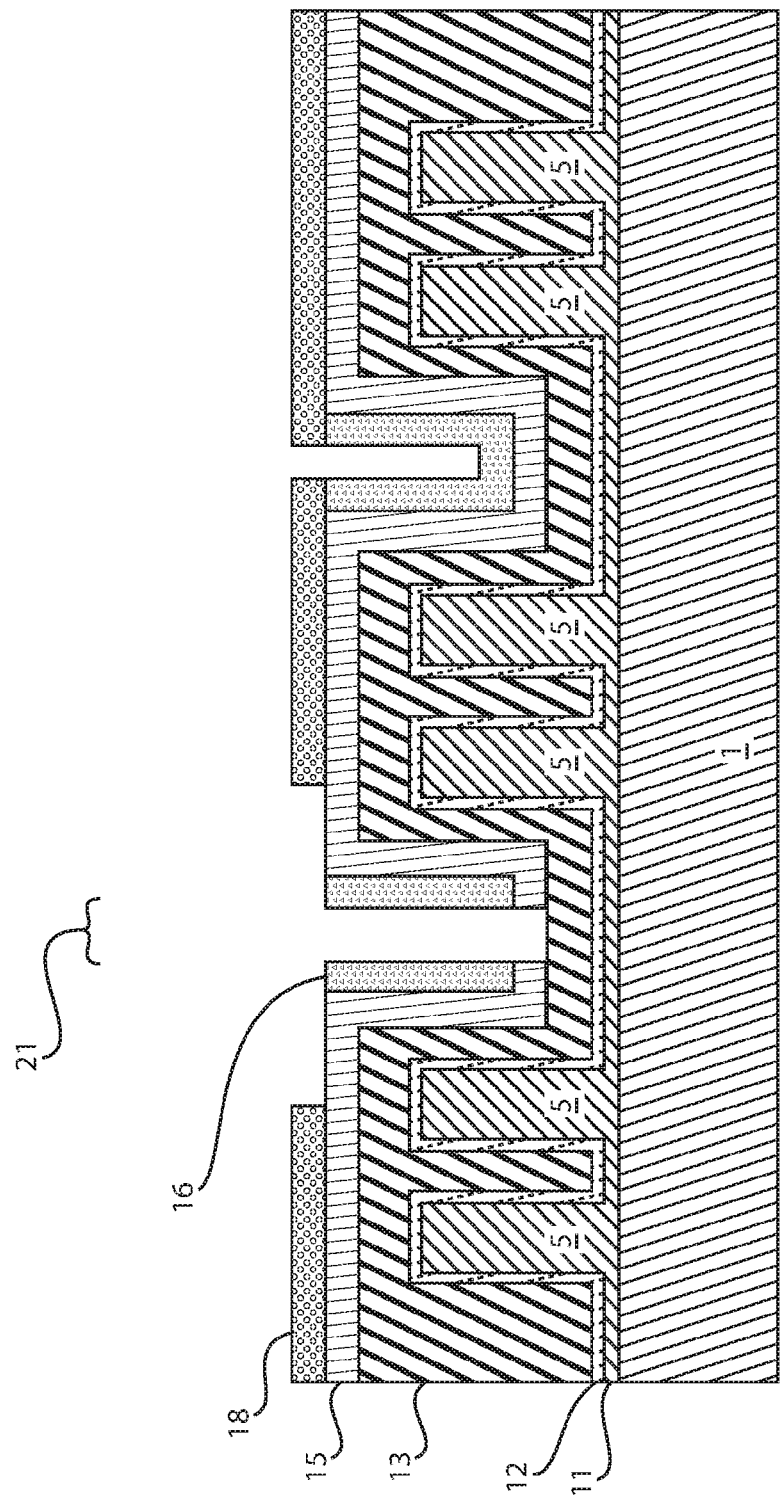
FIG. 9 is a side cross-sectional view depicting removing a photoresist mask.

FIG. 9 depicts removing the photoresist mask 19. The photoresist mask 19 may be removed using selective etching, chemical stripping or oxygen ashing.

Figure 10:
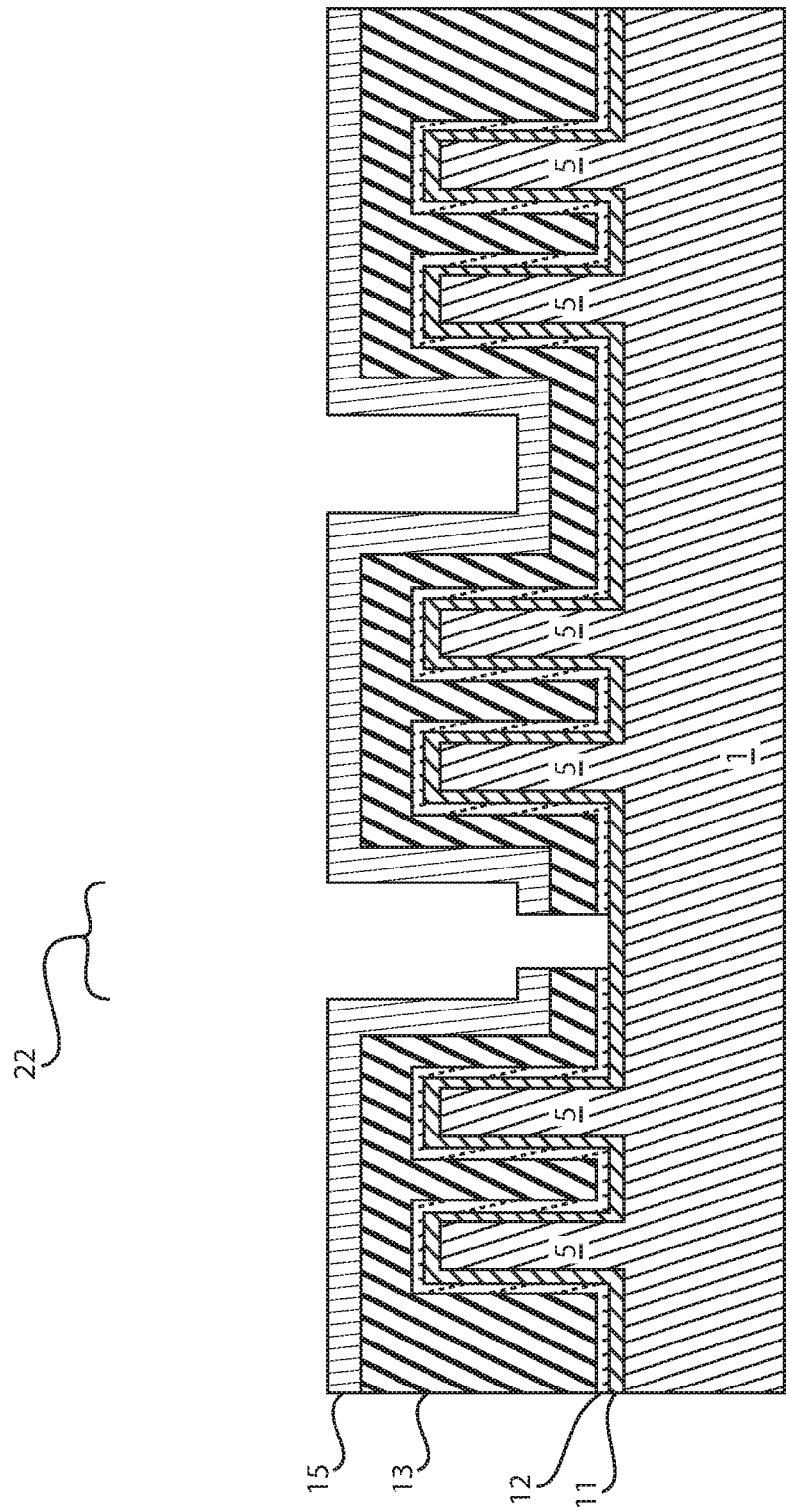
FIG. 10 is a side cross-sectional view depicting one embodiment of etching the gate cut region of the gate structure using the etched first dielectric layer as a gate cut region etch mask.

FIG. 10 depicts one embodiment of etching the gate cut region of the gate structure using the etched first dielectric layer 15 as a gate cut region etch mask that is identified by the opening having reference number 21. In some embodiments, the etch process begins with an oxide reactive ion etch (RIE). This removes the remaining portions of the oxide material layer 17 that were previously underlying the photoresist mask 19. In a following process step, an isotropic etch, e.g., polysilicon isotropic etch, may remove the remaining portion of the semiconductor containing layer 16. The isotropic etch may be a wet chemical etch or an isotropic plasma etch. The above described etch processes are typically selective to at least the first dielectric layer 15. Reactive ion etch (RIE) may then be used to etch the exposed portion of the gate structure providing the gate cut that separates a portion of the gate structure over the fin structures 5 in a first device region from the portion of the gate structure over the fin structures 5 in another device region.

Because of the conformal nature of the first dielectric layer 15, and the semiconductor containing layer 16 that is deposited on the fin structures 5, the second dielectric layer 17 that provides the second fill pinch off is centrally positioned in the space between the adjacent fin structures 5 of two separate device regions. This provides that the gate cut opening is self-aligned to the central portion of the pitch separating the adjacent device regions. Removing the second dielectric layer 17 and etching selectively to the oxide containing material 18, as well as the other combinations of selective etches, that are describe above provide for the alignment of the gate cut region. The portion of the gate structure 11, 12, 13 that is etched, i.e., removed, at this portion of the process flow that provides the gate cut may also be referred to the gate cut trench 22.

Figure 11:
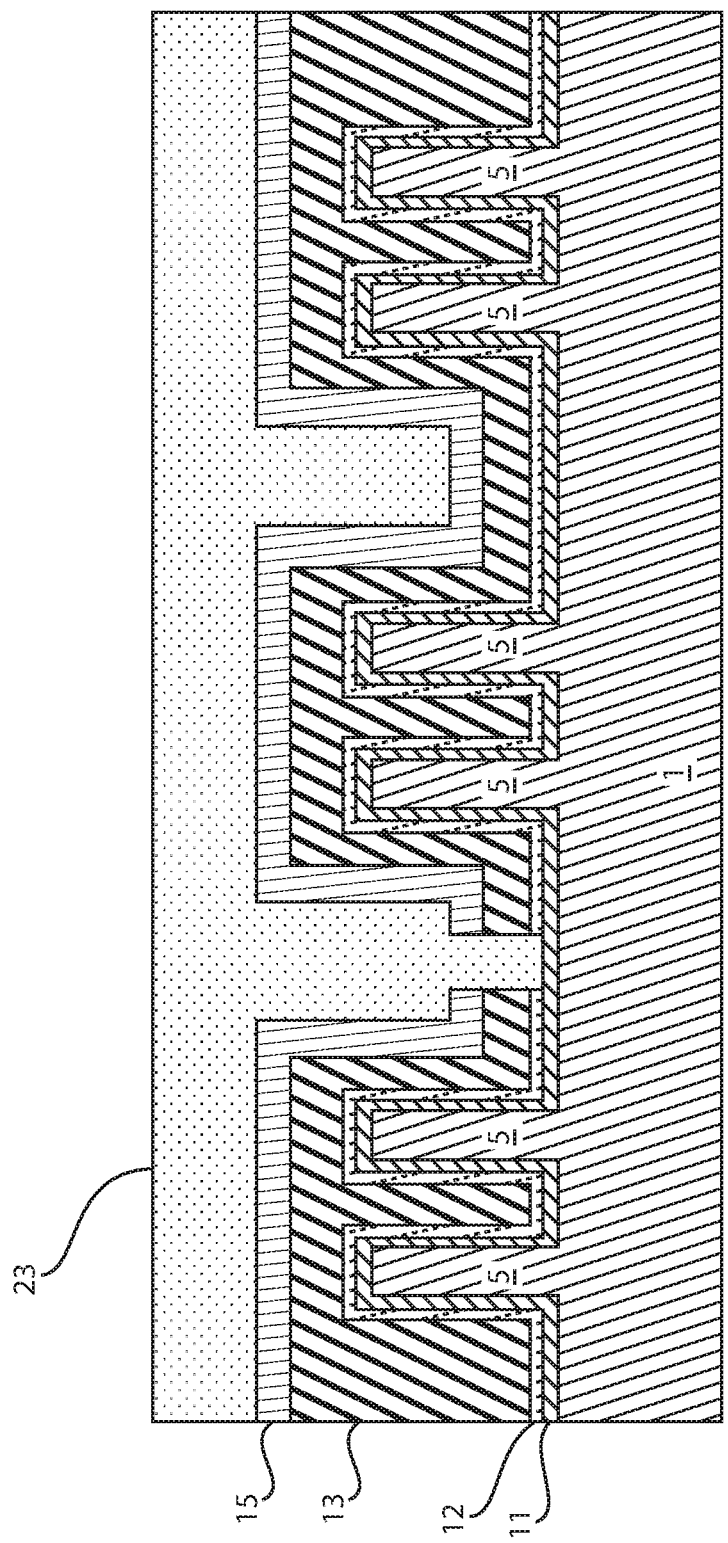
FIG. 11 is a side cross-sectional view depicting one embodiment of filling the gate cut trench with a dielectric.

FIG. 11 depicts one embodiment of filling the gate cut trench 22 with a dielectric material 23. The dielectric material 23 employed at this stage of the process flow may be a nitride, such as silicon nitride, but other materials may also be employed. The dielectric material 23 may be deposited using chemical vapor deposition, spin on deposition or another like deposition process.

In one embodiment, the method described with reference to FIGS. 1-11 provides a semiconductor device that includes at least two regions of fin structures 5, wherein the fin structures within each of the at least two regions has a first pitch P1 of separation and a second pitch P2 of separation is present between adjacent regions. In some embodiments, a gate structure 11, 12, 13 is present on each region of said at least two regions of fin structures 5, wherein the gate structure for each region is separate from an adjacent gate structure by a gate cut trench 22. A conformal dielectric layer 15 (provided by the first dielectric layer 15) is present overlying at least each of the gate structures 11, 12, 13, the conformal dielectric layer has edges aligned to edges of the gate structures at the gate cut trench 22. In some embodiments, the conformal dielectric layer is a nitride, such as silicon nitride. The gate structure may include a gate dielectric 11, a work function material layer 12, and a gate electrode 13, wherein the gate electrode 13 fills a space (provided by the first pitch P1) between the at least to fin structures in at least the two regions of fin structures. The gate cut trench 22 is filled with an interlevel dielectric material 23.

It is to be understood that aspects of the present invention will be described in terms of a given illustrative architecture; however, other architectures, structures, substrate materials and process features and steps can be varied within the scope of aspects of the present invention.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements can be included in the compound and still function in accordance with the present principles. The compounds with additional elements will be referred to herein as alloys.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:

providing at least two regions of fin structures, wherein the fin structures within each of the at least two regions has a first pitch of separation and a second pitch of separation is present between adjacent regions;

forming a gate structure over the fin structures extending across the at least two regions, wherein the gate structure provides a first fill pinch off between the fin structures separated by the first pitch;

forming a material stack on the gate structure of a first dielectric layer, a semiconductor containing layer, and a second dielectric layer, wherein the second dielectric layer provides a second fill pinch off between fin structures separated by the second pitch;

converting an exposed region of the semiconductor containing layer into an oxide material layer;

removing the second dielectric layer that provides the second fill pinch off;

etching an opening in a remaining semiconductor containing layer that was not converted to the oxide material layer that is exposed by removing the second fill pinch off using the oxide material layer as a first etch mask;

etching an exposed portion of the first dielectric layer using the opening in the remaining portion of the semiconductor containing layer as a second etch mask; and etching a gate cut region of the gate structure using the etched first dielectric layer as a gate cut region etch mask.

2. The method of claim 1, wherein the first pitch is less than the second pitch.

3. The method of claim 1, wherein the gate structure comprising a high-k gate dielectric layer present on a channel region of the fin structures, a work function metal layer on the high-k gate dielectric, and a metal containing gate electrode on the work function metal layer.

4. The method of claim 3, wherein the metal containing gate electrode provides the first fill pinch off between the fin structures separated by the first pitch.

5. The method of claim 1, wherein forming the material stack comprises:

conformally depositing the first dielectric layer on the sidewalls of the fin structures, upper surface of the fin structure, and upper surface of semiconductor substrate separating adjacent fin structures;

conformally depositing the semiconductor containing layer on the first dielectric layer, wherein the semiconductor containing layer is overlying the sidewalls of the fin structures, the upper surface of the fin structure, and the upper surface of semiconductor substrate separating adjacent fin structures;

non-conformally depositing the second dielectric layer to provide the second fill pinch off; and planarizing to provide that the second dielectric layer has an upper surface coplanar with an upper surface of the semiconductor containing layer.

6. The method of claim 5, wherein the first dielectric layer is a nitride, the semiconductor containing layer is a silicon containing layer, and the second dielectric layer is a nitride.

7. The method of claim 1, wherein the converting of the semiconductor containing layer into an oxide material layer comprises thermal oxidation.

8. The method of claim 1, wherein said removing the second dielectric layer that provides the second fill pinch off comprises an etch that is selective to the oxide material layer and the semiconductor containing layer.

9. The method of claim 1, wherein said etching an opening in the remaining semiconductor containing layer exposed by removing the second fill pinch off using the oxide material layer as a first etch mask comprises an anisotropic etch.

10. The method of claim 1, wherein said etching the exposed portion of the first dielectric layer using the opening in the remaining portion of the semiconductor containing layer, and said etching the gate cut region of the gate structure using the etched first dielectric layer as a gate cut region etch mask comprises an isotropic wet etch.

11. A method of forming a semiconductor device comprising:

forming a gate structure over a plurality of fin structures, wherein the gate structure provides a first fill pinch off between the fin structures separated by a first pitch;

forming a material stack of a silicon containing layer, and a dielectric layer over the plurality of fin structures, wherein the dielectric provides a second fill pinch off between fin structures separated by a second pitch;

converting an exposed portion of the silicon containing layer into an oxide material layer;

removing the second dielectric layer that provides the second fill pinch off;

etching an opening in a remaining silicon containing layer exposed by removing the second fill pinch off using the oxide material layer as a first etch mask aligned to a gate cut region; and etching an underlying gate cut region in the gate structure using the opening in the remaining portion of the silicon containing layer.

12. The method of claim 11, wherein the gate structure comprising a high-k gate dielectric layer present on a channel region of the fin structures, a work function metal layer on the high-k gate dielectric, and a metal containing gate electrode on the work function metal layer, wherein the metal containing gate electrode provides the first fill pinch off between the fin structures separated by the first pitch.

13. The method of claim 11, wherein forming the material stack comprises: conformally depositing a first dielectric layer on the sidewalls of the fin structures, upper surface of the fin structure, and upper surface of semiconductor substrate separating adjacent fin structures; conformally depositing the silicon containing layer on the first dielectric layer, wherein the silicon containing layer is overlying the sidewalls of the fin structures, the upper surface of the fin structure, and the upper surface of semiconductor substrate separating adjacent fin structures; non-conformally depositing the second dielectric layer on the silicon containing layer to provide the second fill pinch off; and planarizing to provide that the second dielectric layer has an upper surface coplanar with an upper surface of the semiconductor containing layer.

14. The method of claim 11, wherein the converting of the silicon containing layer into an oxide material layer comprises thermal oxidation.

15. The method of claim 11, wherein said removing the second dielectric layer that provides the second fill pinch off comprises an etch that is selective to the oxide material layer and the silicon semiconductor containing layer.

16. The method of claim 11, wherein said etching an opening in a remaining semiconductor silicon containing layer that was not converted into the oxide material layer exposed by removing the second fill pinch off using the oxide material layer as a first etch mask comprises an anisotropic etch.

* * * * *